(12) United States Patent
Rahim et al.

(10) Patent No.: US 7,321,236 B2
(45) Date of Patent: *Jan. 22, 2008

(54) APPARATUS AND METHODS FOR PROGRAMMABLE LOGIC DEVICES WITH IMPROVED PERFORMANCE CHARACTERISTICS

(75) Inventors: Irfan Rahim, San Jose, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/672,444

(22) Filed: Feb. 7, 2007

(65) Prior Publication Data
US 2007/0132482 A1    Jun. 14, 2007

Related U.S. Application Data

(63) Continuation of application No. 11/302,938, filed on Dec. 14, 2005, now Pat. No. 7,183,800.

(51) Int. Cl.
*H03K 17/16* (2006.01)
(52) U.S. Cl. .................................. 326/27; 327/534
(58) Field of Classification Search ............ 326/37–41, 326/26, 27; 327/534, 535; 365/185.18
See application file for complete search history.

(56) References Cited

U.S. PATENT DOCUMENTS 5,880,620 A  *  3/1999  Gitlin et al. .................. 327/534
7,095,266 B2 *  8/2006  Miske ........................... 327/427
7,188,266 B1 *  3/2007  Mendel et al. ............... 713/320

* cited by examiner

*Primary Examiner*—Don Le
(74) *Attorney, Agent, or Firm*—Law Offices of Maximilian R. Peterson

(57) ABSTRACT

Apparatus and methods are disclosed for improving the performance of a programmable logic device (PLD). A PLD includes a memory cell configured to provide a pair of voltages to a gate of a pass transistor and a body of the pass transistor, respectively.

20 Claims, 6 Drawing Sheets

APPARATUS AND METHODS FOR PROGRAMMABLE LOGIC DEVICES WITH IMPROVED PERFORMANCE CHARACTERISTICS

CROSS REFERENCE TO RELATED APPLICATIONS

This patent application is a continuation of, and incorporates by reference in its entirety, U.S. patent application Ser. No. 11/302,938 filed Dec. 14, 2005 now U.S. Pat. No. 7,183,800, titled "Apparatus and Methods for Programmable Logic Devices with Improved Performance Characteristics," filed on Dec. 14, 2005.

TECHNICAL FIELD

The inventive concepts relate generally to circuitry and associated methods for improving the performance of electronic circuitry. More particularly, the invention concerns apparatus and associated methods for improving performance characteristics of programmable logic devices (PLDs) or portions of PLDs, such as multiplexers (MUXs) included in PLDs.

BACKGROUND

Modern PLDs include a relatively large number of pass transistors. The pass transistors may reside in a variety of PLD circuits, such as MUXs used in various PLD blocks. The pass transistors typically transmit a signal from one of their terminals (say, the source) to another terminal (say, the drain) in response to a control signal (e.g., a voltage applied to the gate terminal). Because of technological advances in device fabrication techniques, device features have shrunk in size (sometimes referred to as "technology scaling"). As a related phenomenon, supply voltages have decreased (also known as "voltage scaling").

Threshold voltages of the transistors, however, have failed to scale in a proportionate manner. In other words, threshold voltages have decreased, although at a slower rate or pace. Consequently, the performance of the pass transistors has tended to suffer, especially in the second stages of MUXs, as the threshold voltages preclude a high-enough drive-current capability, given the supply voltage levels typically available. A need therefore exists for improving the performance of PLDs or portions of PLDs, such as pass transistors used in MUXs or other circuitry.

SUMMARY

The disclosed novel concepts relate to apparatus and methods for improving the performance characteristics of PLDs or portions of PLDs, such as MUXs that use pass transistors, etc. In one embodiment, a PLD includes a memory cell that is configured to provide one voltage to a gate of a pass transistor and another voltage to a body of the pass transistor. In another embodiment, a circuit arrangement includes a composite configuration memory cell, and a pass transistor coupled to the composite configuration memory cell. The composite configuration memory cell supplies a voltage to a gate of the pass transistor. The composite configuration memory cell supplies another voltage to a body of the pass transistor.

Yet another embodiment relates to a method of coupling resources within a PLD via a pass transistor, which depends on the state of a configuration memory cell. The method includes supplying one set of voltages to the gate and the body of the pass transistor when the configuration memory cell is in one state, and supplying another set of voltages to the gate and the body of the pass transistor when the configuration memory cell is in another state.

BRIEF DESCRIPTION OF THE DRAWINGS

The appended drawings illustrate only exemplary embodiments of the invention and therefore should not be considered or construed as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate apparatus and methods for improving performance characteristics of PLDs. More specifically, the disclosed novel concepts provide techniques for overcoming performance limitations of pass transistors in PLDs, for example, pass transistors in MUXs (especially second-stage pass transistors, and especially during a 0-to-1 transition). The inventive concepts improve the performance of pass transistors (and, hence, the performance of MUXs or other circuits that include the pass transistors) by providing separate gate and body voltages to the pass transistors, as described below in detail.

Figure 1:
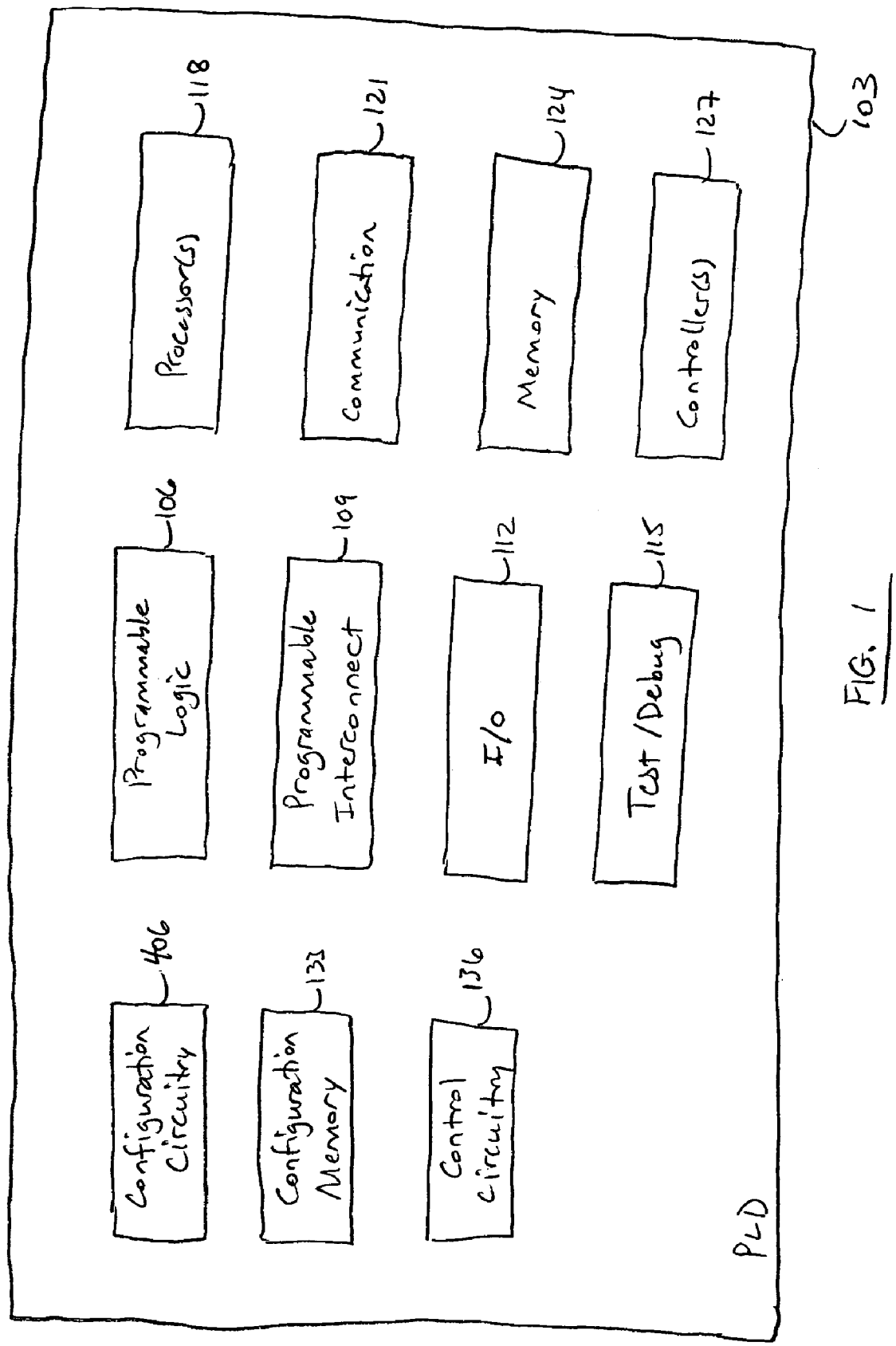
FIG. 1 shows a general block diagram of a PLD according to an illustrative embodiment of the invention.

One may apply the inventive concepts to a variety of programmable integrated circuits, such as PLDs. FIG. 1 shows a general block diagram of a PLD 103 according to an illustrative embodiment of the invention. PLD 103 includes configuration circuitry 130, configuration memory (CRAM) 406, control circuitry 136, programmable logic 106, programmable interconnect 109, and I/O circuitry 112. CRAM 406 provides a plurality of voltages to all or a selected number of pass transistors in PLD 103, as described below in detail.

In addition, PLD 103 may include test/debug circuitry 115, one or more processors 118, one or more communication circuitry 121, one or more memories 124, one or more controllers 127, as desired. The choice and number of the blocks depends on a number of factors, such as design and performance specifications, as persons of ordinary skill in the art who have the benefit of the description of the invention understand.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and to other blocks and circuitry within PLD 103, as desired. As described below in detail, programmable interconnect 109 provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103. Configuration data are typically used to store information in CRAM 406. The contents of CRAM 406 determine the functionality of various blocks of PLD 103, such as programmable logic 106 and programmable interconnect 109.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired. As persons of ordinary skill in the art who have the benefit of the description of the invention understand, rather than using a dedicated DSP, one may use the logic resources of PLD 103 to implement DSP functionality, as desired.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the description of the invention understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Note that FIG. 1 shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Currently, typical PLDs use metal oxide semiconductor (MOS) transistors (usually as part of a complementary MOS, or CMOS, arrangement) as pass transistors. A typical MOS transistor has source, drain, gate, and body terminals, as persons of ordinary skill in the art understand. The drain current of the MOS transistor in the saturation region of operation depends on the threshold voltage and the gate-to-source voltage of the transistor:

$$i_D = K(v_{GS} - V_T)^2,$$

where $i_D$=the total drain current (i.e., including AC and DC components),

K=a constant, $V_{GS}$=the total gate-to-source voltage (i.e., including AC and DC components), and $V_T$=the threshold voltage.

The threshold voltage, $V_T$, depends on a number of factors, such as the voltage between the source and body terminals of the transistor. The following equation provides the threshold voltage as a function of the body-to-source voltage:

$$V_T = V_{T(0)} + \gamma \left\{ \sqrt{2\phi_F - v_{BS}} - \sqrt{2\phi_F} \right\}$$

where $V_{T(o)}$=the threshold voltage with the source-to-body voltage (or body-to-source voltage) set to zero, γ=the body factor, a constant that depends on the doping levels of the body, $\phi_F$=a constant, and $v_{BS}$=the total body-to-source voltage (i.e., including AC and DC components).

Note that when the body-to-source voltage, $V_{BS}$ equals zero, the threshold voltage, $V_T$, equals $V_{T(o)}$. By adjusting the body-to-source voltage, one may increase or decrease the threshold voltage of the transistor.

As the above equations show, the drain current and, hence, the current-drive capability of the transistor for a given gate-to-source voltage, depends on the threshold voltage. In other words, the higher the threshold voltage, the less the current-drive capability of the transistor, and vice-versa. Thus, to increase the transistor's current-drive capability, one would normally desire to decrease its threshold voltage.

Decreasing the threshold voltage, however, increases the off-state leakage current, $I_{off}$. An elevated level of the off-state leakage current has the undesirable effect of increased power consumption or dissipation of the transistor and, hence, of the PLD overall. As a result, a trade-off exists between the value of the threshold voltage, as set by the physical characteristics of the transistor and by the body-to-source voltage (and therefore the current-drive capability of the transistor) and its off-state leakage current. In conventional approaches, one would have to choose one factor versus the other, or trade off one performance characteristic for the other.

Figure 2:
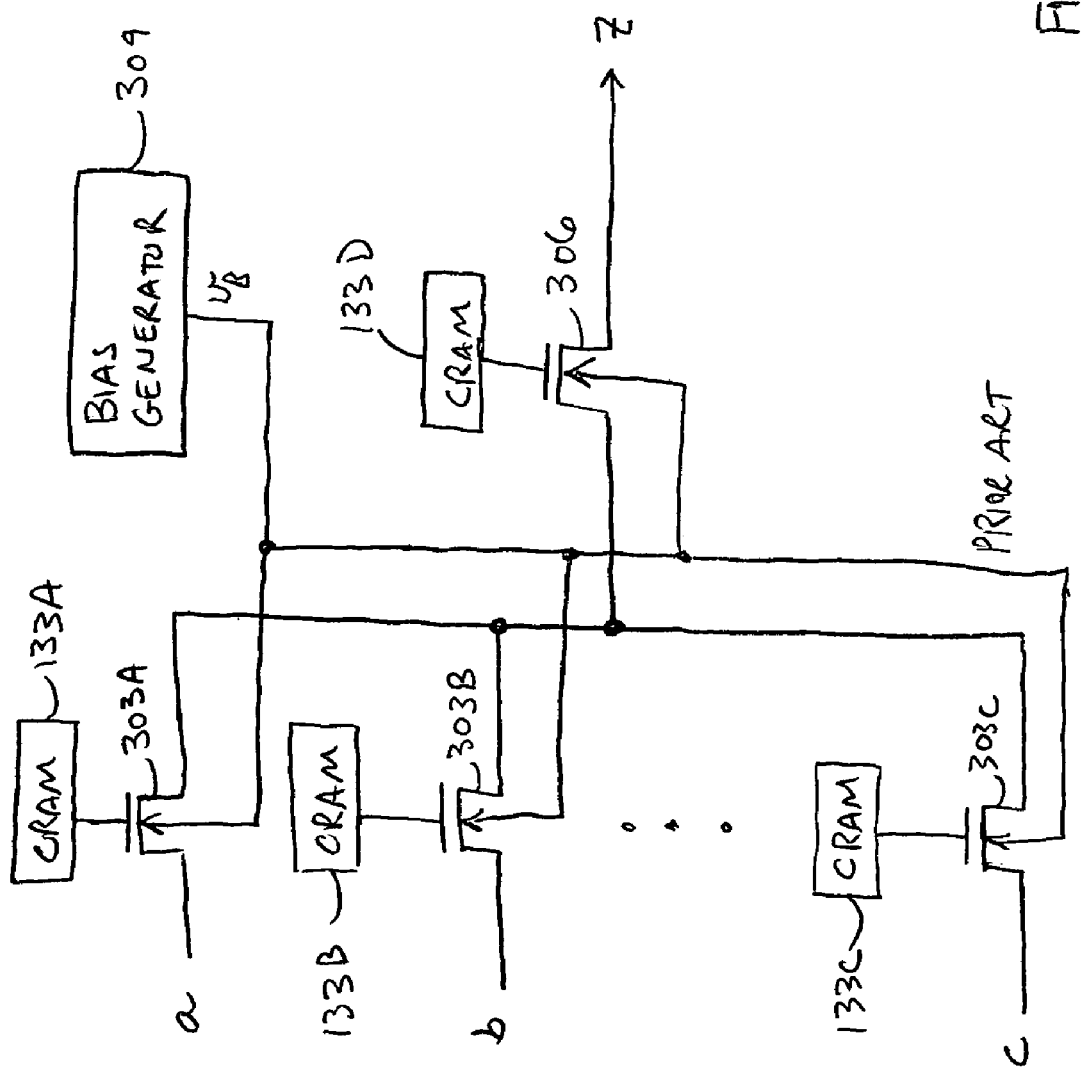
FIG. 2 illustrates a conventional MUX used in traditional PLDs.

FIG. 2 shows a conventional MUX, with the pass transistors biased in a traditional manner. More specifically, the first stage of the MUX includes transistors 303A-303C, and the second stage of the MUX includes transistor 306. CRAM cells 133A-133D provide the gate voltages of the transistors in the first and second stages of the MUX, respectively. Bias generator 309 provides a body bias to the transistors in both the first and second stages of the MUX.

As noted above, a trade-off exists between the current-drive capability (and speed of operation) of transistors 303A-303C and 306, and their off-state current. In the conventional circuit arrangement in FIG. 2, bias generator 309 provides a bias voltage to the bodies of the transistors separately from the gate voltages supplied by CRAM cells 133A-133D. For the reasons described above, the performance of the pass transistors tends to suffer, especially pass transistor 306 in the second stage of the MUX.

The inventive concepts provide a way of decreasing the gate voltage during the on-state of the pass transistor, and decreasing the leakage current during its off-state. More specifically, pass transistors according to exemplary embodiments of the invention receive both their gate voltages and body voltages from modified or composite CRAM cells.

Figure 3:
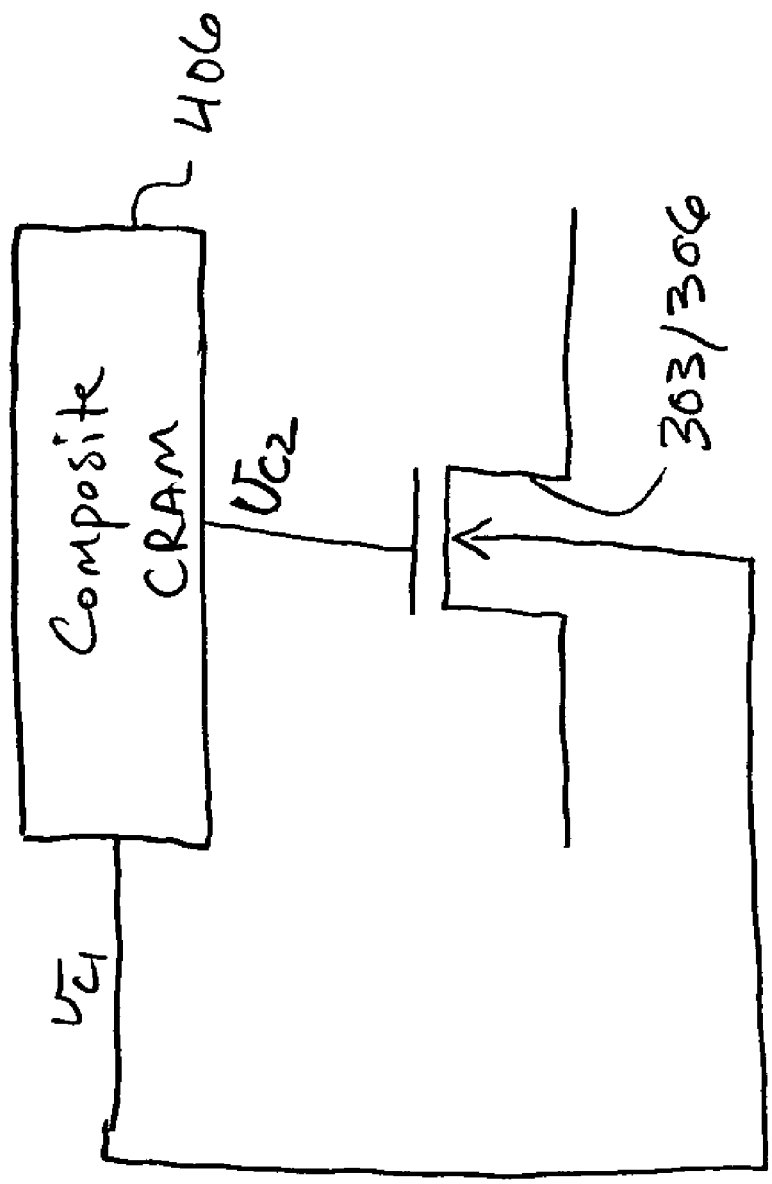
FIG. 3 depicts a simplified block diagram of a composite configuration memory (CRAM) for supplying voltages to a corresponding pass transistor.

FIG. 3 shows a simplified block diagram according to the invention of a composite configuration memory (CRAM) for supplying voltages to a corresponding pass transistor. More specifically, composite CRAM 406 provides voltage $V_{c1}$ to the body of transistor 303/306. Composite CRAM 406 further supplies a separate voltage $V_{c2}$ to the gate of transistor 303/306.

Composite CRAM 406 has two states. In the first state, voltage $V_{c1}$ has a logic high value. That level of voltage $V_{c1}$ turns ON transistor 303/306. Voltage $Vc_2$ has a value higher than a logic low value (e.g., 0.4 volts higher than logic low). That value of voltage $V_{c2}$ biases the body of transistor 303/306 so as to reduce or minimize its threshold voltage.

More specifically, an elevated body bias increases the body-to-source voltage which, according to the equation presented above, reduces the threshold voltage of transistor 303/306. For a given gate-to-source voltage (the gate drive voltage), the reduced threshold voltage results in an increased drain current, i.e., increased current-drive capability.

Simultaneously, the values of voltages $V_{c1}$ and $V_{c2}$ increase the saturation drain current ($I_{dsat}$). Put another way, for a given gate-to-source voltage, the decrease in the threshold voltage causes the drain saturation current to increase, thus aiding the current capability of transistor 303/306.

In the second state, both $V_{c1}$ and $V_{c2}$ have logic low values. Note that, theoretically, one may apply a negative $V_{c2}$, as desired. As a result, the threshold voltage of transistor 303/306 increases. Given the zero or negative body bias and the reduced gate-to-source voltage, the off-state leakage current ($I_{off}$) decreases or minimizes. The reduction in the off-state leakage current helps to improve the performance of the PLD by decreasing its overall power consumption.

Figure 4:
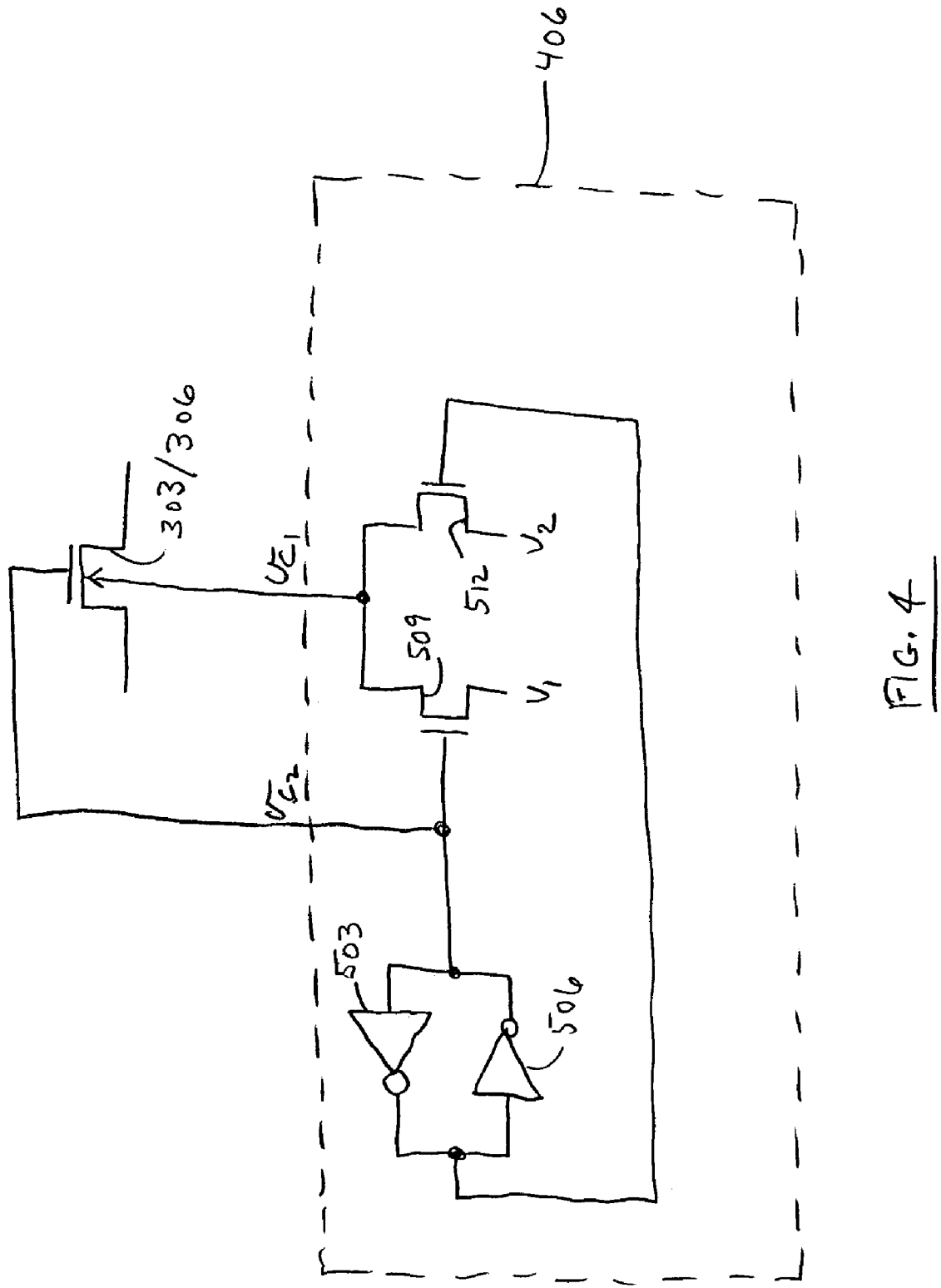
FIG. 4 shows a circuit arrangement for a composite CRAM and a corresponding pass transistor according to an exemplary embodiment of the invention.

FIG. 4 shows a circuit arrangement for a composite CRAM and a corresponding pass transistor according to an exemplary embodiment of the invention. The circuit arrangement includes transistors 509 and 512, and inverters 503 and 506 in a back-to-back configuration. An output of inverter 503 drives the gate of transistor 512, whereas an output of inverter 506 drives the gate of transistor 509 and also provides voltage $V_{C2}$ to the gate of pass transistor 303/306.

Depending on the output voltages of inverters 503 and 506, transistors 509 and 512 supply either voltage $V_1$ or voltage $V_2$ to the body of pass transistor 303/306. More specifically, when the outputs of inverter 503 and 506 have logic low and high values, respectively, transistor 509 is ON, and transistor 512 is OFF. As a result, transistor 509 couples voltage $V_1$ (i.e., as $V_{c2}$) to the body of transistor 303/306.

Conversely, when the outputs of inverters 503 and 506 have logic high and low values, respectively, transistor 509 is OFF, and transistor 512 is ON. As a result, transistor 512 couples voltage $V_2$ (i.e., as $V_{c2}$) to the body of transistor 303/306.

By selecting appropriate values of voltages $V_1$ and $V_2$, one may provide the advantages of low off-state leakage current and high current-drive-capability for transistor 303/306, as described above. As example, voltages X may have the values specified in Table 1:

TABLE 1

| Stage of Transistor 303/306 | Gate Voltage of Transistor 303/306 | Body Voltage of Transistor 303/306 |
|---|---|---|
| ON | 1.0 V | 0.4 V |
| OFF | 0.0 V | 0.0 V |

Note that, as persons of ordinary skill in the art who have the benefit of the description of the invention understand, voltages $V_1$ and $V_2$ may have a wide variety of other values, as desired. The choice of voltage values depends on a number of factors, such as the characteristics of transistor 303/306, the desired design and performance specifications, and the like, as persons of ordinary skill in the art who have the benefit of the description of the invention appreciate.

Figure 5:
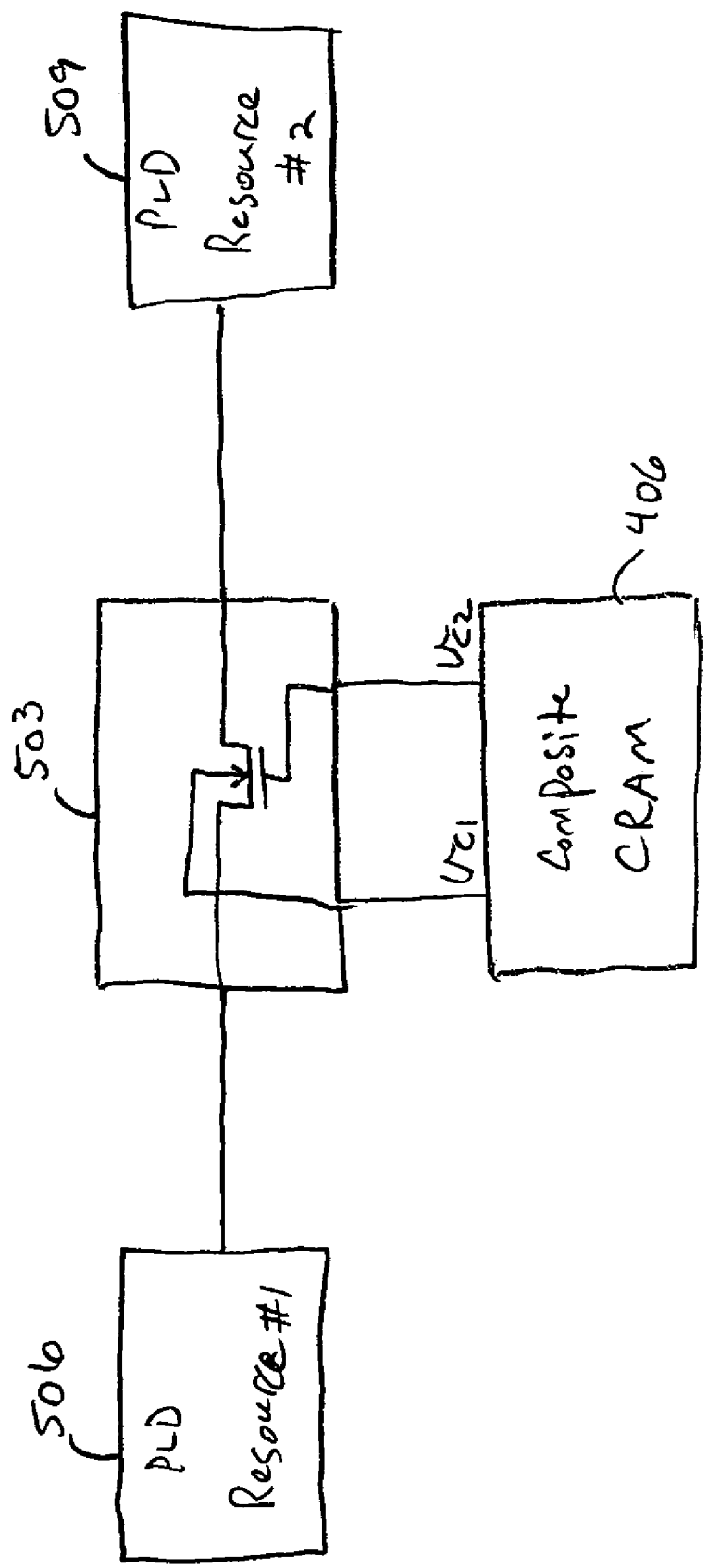
FIG. 5 depicts a pass transistor arrangement according to an illustrative embodiment of the invention used to couple two PLD resources to one another.

One may use the circuit arrangements in FIG. 3 or FIG. 4 to couple together various PLD resources, such as the blocks shown in FIG. 1 or other circuitry within the PLD, as desired. FIG. 5 depicts a pass transistor arrangement according to an illustrative embodiment of the invention used to couple two PLD resources to one another.

More specifically, pass transistor 503 couples PLD resource 506 to PLD resource 509. Composite CRAM cell 406 provides two voltages to transistor 503, as described above. Pass transistor 503 allows PLD resource 506 and PLD resource 509 to communicate with each other with the advantages described above, and without the shortcoming of the conventional approach.

Note that, rather than a single pass transistor, one may use a variety of more complex arrangements, as desired, and as persons of ordinary skill in the art who have the benefit of the description of the invention understand. As one example, one may use an appropriate number of composite CRAM cells to provide corresponding voltages to a number of pass transistors arranged as a MUX. The MUX may provide part or all of the functionality of programmable logic 106, programmable interconnect 109, or other desired functionality in PLD 103, as desired.

Note that one may use the composite CRAM cells (e.g., as shown in the circuit arrangement of FIG. 3) selectively. In other words, for a given block or arbitrary circuit within PLD 103, one may use the conventional approach for some pass transistors and yet use composite CRAM cells for other pass transistors (or MUXs or other desired structures).

Figure 6:
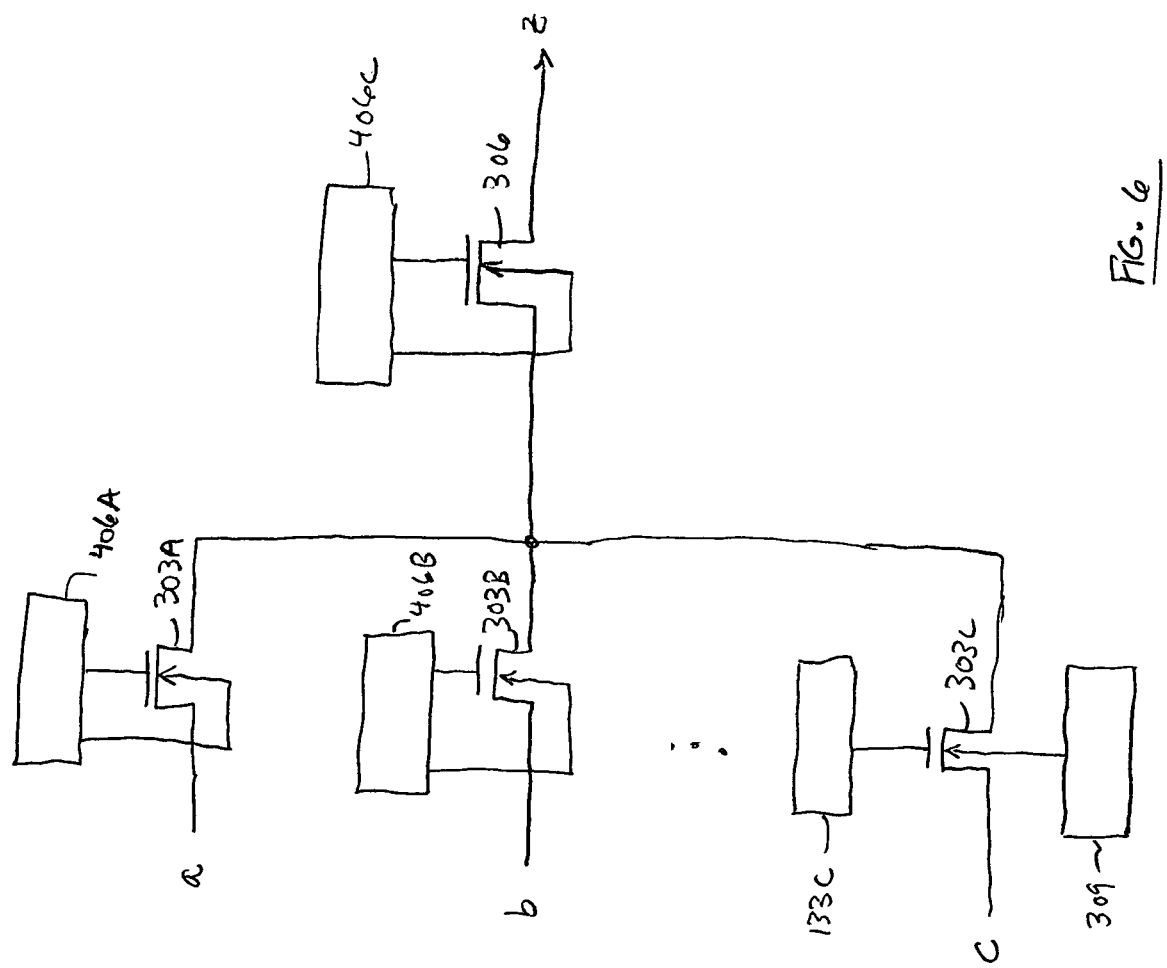
FIG. 6 illustrates selective application of voltages generated by composite CRAM cells according to the invention to respective pass transistors in a PLD.

FIG. 6 illustrates selective application of voltages generated by composite CRAM cells according to the invention to respective pass transistors in a PLD. More specifically, FIG. 6 shows a three-input MUX, with inputs a, b, and c, and output z. Each input of the MUX couples to a corresponding pass transistor. Thus, input a couples to pass transistor 303A, input b couples to pass transistor 303B, and input c couples to pass transistor 303C.

Composite CRAM cells 406A and 406B drive the gates and bodies of transistors 303A and 303B, respectively. Conventional CRAM cell 133C drives the gate of transistor 303C. Bias generator 309 provides a bias to the body of transistor 303C. Thus, composite CRAM cells 406A-406B provide respective transistors 303A-303B with the benefits described above. Conventional CRAM 133C, however, drives transistor 303C. As a result, transistor 303C has lower performance characteristics than do transistors 303A-303B.

Note that composite CRAM cell 406C couples to transistor 306, and drives its gate and body. That arrangement provides a higher-performance path from inputs a and b to output z, while providing a lower-performance path from input c to output z.

One may implement the inventive concepts using a variety of semiconductor structures, as desired, and as persons of ordinary skill in the art who have the benefit of the description of the invention understand. For example, one may implement the novel circuit arrangements described above and shown in the drawings in bulk metal oxide semiconductor (MOS), complementary MOS (CMOS), or silicon-on-insulator (SOI), as desired.

Furthermore, one may apply the inventive concepts to a variety of pass transistors, as desired, and as persons of ordinary skill in the art who have the benefit of the description of the invention understand. For example, the pass transistors may constitute n-type MOS (NMOS) transistors, p-type MOS (PMOS) transistors (with modifications that fall within the knowledge of persons of ordinary skill in the art who have the benefit of the description of the invention), or CMOS circuit arrangements, as desired.

Note that one may generally apply the inventive concepts effectively to various integrated circuits (ICs) (or even discrete logic), such as custom ICs, and programmable ICs that include programmable or configurable logic circuitry, known by various names in the art, as desired, and as persons skilled in the art with the benefit of the description of the invention understand. Such circuitry includes, for example, devices known as complex programmable logic device (CPLD), programmable gate array (PGA), structured application specific ICs (structured ASICs), and field programmable gate array (FPGA).

Furthermore, one may use the inventive concepts in a variety of electronic circuitry and systems, such as SOCs and SOPCs, as desired. The details of implementation fall within the knowledge of persons of ordinary skill in the art who have the benefit of the description of the invention.

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand. Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

The invention claimed is:

1. A programmable logic device (PLD), comprising a memory cell configured to provide a first voltage to a gate of a pass transistor and a second voltage to a body of the pass transistor.

2. The programmable logic device (PLD) according to claim 1, wherein the pass transistor has improved current-drive capability.

3. The programmable logic device (PLD) according to claim 1, wherein the pass transistor has improved off-state leakage current.

4. The programmable logic device (PLD) according to claim 1, wherein the pass transistor resides in a multiplexer (MUX).

5. The programmable logic device (PLD) according to claim 1, wherein the pass transistor resides in programmable logic circuitry within the PLD.

6. The programmable logic device (PLD) according to claim 1, wherein the pass transistor resides in programmable interconnect circuitry within the PLD.

7. The programmable logic device (PLD) according to claim 1, wherein the pass transistor couples a first resource within the PLD to a second resource within the PLD.

8. A method of operating a programmable logic device (PLD), the method comprising:
  supplying from a memory cell a first voltage to a gate of a pass transistor; and
  supplying from the memory cell a second voltage to a body of the pass transistor.

9. The method according to claim 8, wherein supplying the first voltage provides the pass transistor with improved current-drive capability.

10. The method according to claim 8, wherein supplying the second voltage provides the pass transistor with improved off state leakage current.

11. The method according to claim 8, wherein the pass transistor resides in a multiplexer (MUX).

12. The method according to claim 8, wherein the pass transistor resides in programmable logic circuitry within the PLD.

13. The method according to claim 8, wherein the pass transistor resides in programmable interconnect circuitry within the PLD.

14. The method according to claim 8, wherein the pass transistor couples a first resource within the PLD to a second resource within the PLD.

15. A programmable logic device (PLD), comprising:
   a pass transistor; and
   a configuration memory cell, comprising a memory circuit coupled to first and second transistors, wherein the first transistor supplies a first voltage to a gate of the pass transistor, and the second transistor supplies a second voltage to a body of the pass transistor.

16. The programmable logic device (PLD) according to claim 15, wherein the first voltage causes a reduction of a threshold voltage of the pass transistor.

17. The programmable logic device (PLD) according to claim 15, wherein the second voltage causes a reduction of an off-state leakage current of the pass transistor.

18. The programmable logic device (PLD) according to claim 15, wherein the pass transistor comprises a metal oxide semiconductor field effect transistor (MOSFET).

19. The programmable logic device (PLD) according to claim 15, wherein the pass transistor comprises a p-type metal oxide semiconductor (PMOS) transistor.

20. The programmable logic device (PLD) according to claim 15, wherein the pass transistor comprises an n-type metal oxide semiconductor (NMOS) transistor.

* * * * *